July 9, 1957 H. WELKER 2,798,989

SEMICONDUCTOR DEVICES AND METHODS OF THEIR MANUFACTURE

Filed March 10, 1952 2 Sheets-Sheet 1

Inventor:
Heinrich Welker
By C. M. Avery
Attorney

SEMICONDUCTOR DEVICES AND METHODS OF THEIR MANUFACTURE

Filed March 10, 1952 2 Sheets-Sheet 2

Inventor:
Heinrich Welker
By C. M. Avery
Attorney

United States Patent Office 2,798,989

Patented July 9, 1957

2,798,989

SEMICONDUCTOR DEVICES AND METHODS OF THEIR MANUFACTURE

Heinrich Welker, Erlangen, Germany, assignor to Siemens-Schuckertwerke Aktiengesellschaft, Berlin-Siemensstadt, Germany Application March 10, 1952, Serial No. 275,785

Claims priority, application Germany March 10, 1951

15 Claims. (Cl. 317—237)

My invention relates to semiconductors for electric resistance devices, rectifiers, amplifiers, detectors, control apparatus, photocells and other technological purposes, as well as to methods of producing such semiconductors, and is described hereinafter with reference to the drawings in which Figs. 1 to 12 illustrate schematically different respective embodiments of electric devices according to the invention. More particularly:

Figure 1:
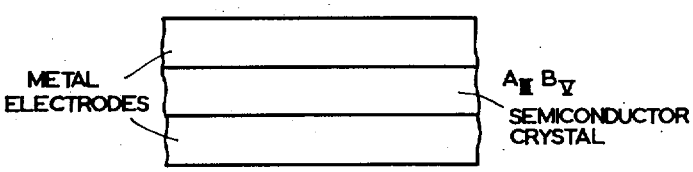
Figs. 1, 2 and 3 represent diagrammatically three respective semiconductor devices and include explanatory legends in accordance with the description given in the following.

During the recent past, the elements in the second subgroup of the fourth group of the periodic system (C, Si, Ge, Sn) have gained prominence as semiconductors for rectifiers, crystal detectors and crystal amplifiers, as well as for photoelectric, thermoelectric and other applications. Carbon, which is a semiconductor only in its diamond modification, has so far been of merely scientific interest due to the high price of diamonds and the impossibility of producing them synthetically. Silicon has been useful in crystal detectors for electromagnetic waves, although the production of its crystals in pure condition still encounters extreme difficulties so that the theoretical upper limit of its electric resistance is far from being attained. Germanium can be produced with a purity virtually up to the theoretical upper limit of its electrical resistance. For that reason, germanium, in spite of its high cost, has largely superseded silicon for detectors and has afforded the possibility of producing controllable crystal devices for industrial applications. Tin, here of interest only in its gray, diamond-latticed modification, has so far been of scientific interest only, since gray tin is stable only at inconveniently low temperatures and cannot readily be produced in large crystals.

The four mentioned elements have the common characteristic of a diamond lattice, exhibiting the essential particularity that any atom within the crystal lattice is adjacent to four other atoms which occupy the corners of a regular tetrahedron with the first atom on its center. The atoms are linked together by a polarized, saturable valence force acting between immediately adjacent atoms. Each such bond is occuplied by two electrons which, as such, do not contribute to the electric conductivity. Closely related to these linkage conditions is the extreme mobility, in such bodies, of electrons released photoelectrically or coming from points of disturbance, this mobility reaching values of 3,000 cm.$^2$/volt sec. in germanium. Another value of great significance for the semiconductive qualities of these substances is the size of the energy band forbidden for the electrons. The size of this band decreases progressively with the increasing atomic number of the elements. It amounts to 6 to 7 e. v. (electron volt) for diamond, 1.1 e. v. for silicon, 0.7 e. v. for germanium, and 0.1 e. v. for gray tin.

The importance of the four substances for the physics and technology of semiconductors on the one hand, and the various inherent difficulties on the other hand, such as the infeasible synthetic production of diamond, the difficult production of pure crystals of silicon, the high cost of germanium and the instability of the diamond lattice of gray tin, pose the problem of finding new substances which possess the important characteristic of a saturated homopolar linkage of one center atom to the four next neighbor atoms. For technological reasons, it is further desired to find a possibility of varying the width of the electron-forbidden band in a more continuous manner than offered by the series C, Si, Ge, Sn.

It is an object of the invention to solve these problems.

To this end, and in accordance with the invention, a semiconductor for the purposes mentioned is provided by employing a compound of an element $A_{III}$ of the third group of the periodic system with an element $B_{V}$ of the fifth group. These compounds are of the type $A_{III}B_{V}$, in which $A_{III}$ is an element of the second subgroup in group III, and $B_{V}$ is an element of the second subgroup in group V of the periodic system. The second subgroup in Group III comprises the elements: boron (B), aluminum (al), gallium (Ga), indium (In) and thallium (Tl). The second subgroup in group V comprises the elements: nitrogen (N), phosphorus (P), arsenic (As), antimony (Sb) and bismuth (Bi). Compounds produced of any two elements of the respective two subgroups are semiconductive, but such compounds of the high-atomic elements Tl and Bi have not been available or have been found much less suitable than those of the remaining four elements of each subgroup. For that reason, the term $A_{III}B_{V}$ is hereinafter used to denote only compounds of an element selected from boron, aluminum, gallium, indium with an element selected from nitrogen, phosphorus, arsenic and antimony. Semiconductors of this type greatly reduce or avoid the abovementioned difficulties and, as regards their properties, may be looked upon as representing, so to say, replicas or good substitutes of the four above-mentioned tetravalent semiconductive elements. Examples of such $A_{III}B_{V}$ compounds are the following:

Substitutes for Si: AlP, GaN
Substitutes for Ge: GaAs, AlSb, InP
Substitute for gray Sn: InSb The substitution is especially complete as regards the lattice spacing. Thus the spacing of:

Si—Si=2.35 A., and of AlP=2.36 A.
Ge—Ge=2.43 A., and of GaAs=2.435 A.
Sn—Sn=2.79 A., and of InSb=2.79 A.

The invention also offers the possibility of producing semiconductive compounds which correspond to extant or theoretical combinations of the four elements of the fourth group. For example:

Substitutes for Si—C: BP, AlN
Substitutes for Si—Ge (nonexistent): AlAs, GaP
Substitutes for Ge—Sn (nonexistent): GaSb, InAs Referring now to Fig. 1, it will be understood that, as a rule, a semiconductor according to the invention, when used as a component of an electrical device, is joined with two electrodes of metal or other conductive material. While in Fig. 1, the electrodes are flat and form with the $A_{III}B_{V}$ semiconductor, a sandwich structure as customary for dry rectifiers such as the one shown in Fig. 7 and described below, the electrodes as well as the semiconductor crystal may be given other shapes, such as those apparent from Figs. 4 to 6 and 8, depending upon the particular design or purpose. Regardless of the shape and combination in which the semiconductive compounds $A_{III}B_{V}$ are used, these compounds offer distinct advantages over the known semiconductor crystals as will appear from the following.

The crystal lattices of the compounds $A_{III}B_{V}$ differ from those of the corresponding elements of the fourth group. As mentioned, in the fourth-group elements the lattice points are occupied by tetravalent positive ions bonded together by a homopolar valence force. In the compounds $A_{III}B_{V}$, the lattice points are occupied by the third-group elements as trivalent ions and by the fifth-group elements as pentavalent ions, while the remaining (3+5=) eight electrons form the linking bond between neighboring atoms, each bond being occupied by two electrons.

The resulting slight ionic proportion of the compounds of the type $A_{III}B_{V}$ is accompanied by remarkable physicochemical properties. Due to the quantum-mechanical resonance between the ionic portion and the homopolar portion, the melting point of the $A_{III}B_{V}$ compound is higher than that of the otherwise closely corresponding fourth-group element. For example, the melting point of germanium is 960° C., while the substitute compound AlSb melts at 1050° C. The width of the forbidden band is also increased, this increase being proportionately larger than that of the melting point. Consequently, the $A_{III}B_{V}$-type compounds offer the technological advantage of having for a given melting point a wider forbidden band than the corresponding fourth-group element. Thus, the compound AlSb, melting at 1050° C., has a forbidden band which is wider not only than that of germanium, but also than the forbidden band of a fictitious element of the fourth group with a theoretical melting point of 1050° C. Hence the compound AlSb, as regards its theoretical upper limit of electrical resistance, approaches pure silicon (melting at 1450° C.), while having over silicon the advantage of a relatively low melting point better suitable for technological fabricating methods.

It may seem that compounds of the type $A_{II}B_{VI}$ (for instance, ZnS), already known as semiconductors, would exhibit the above-mentioned advantages in a still larger measure. However, due to their stronger ionic character, the forbidden band of these substances is so much widened that these compounds, in thermal equilibrium, are noticeably close to insulators. Therefore, these substances have found technological use only in conjunction with optical phenomena (interval photo effect). Hence, the semiconductors of the type $A_{III}B_{V}$ may be considered as occupying the electrically important intermediate position between the tetravalent semiconductive elements and the quasi-insulating substance of the type $A_{II}B_{VI}$.

According to a more specific feature of the invention, those compounds $A_{III}B_{V}$ are preferably used as semiconductors that crystallize in the cubic zinc-blende (ZnS) lattice. This lattice converts into the diamond lattice when A becomes identical with B, so that it will be apparent that these compounds have a particular similarity to the elements of the fourth group.

For producing the compounds $A_{III}B_{V}$ it is especially important that the individual components can evaporate from the molten compound only to a slight degree. Since the elements of the third group are generally less volatile than those of the fifth group, it suffices to make a suitable selection in the latter group only.

According to another feature of the invention, indium antimonide (InSb) is preferably chosen from among the antimonides. This compound has a stable cubic lattice of the zinc-blende type, and therefore represents a good substitute for the unstable gray tin. Indium antimonide is employed especially when electrically a relatively high intrinsic conductance (mingled electron-hole conductance) is required from the pure compound.

Aluminum antimonide, according to another feature of the invention is employed as a substitute for germanium. This compound, in its pure monocrystalline condition, has an intrinsic conductance smaller than that of germanium. Since the compound does not involve the slightest problems as regards raw material, it is superior to germanium mainly in economical respects.

Gallium antimonide is employed according to the invention if a semiconductive body is required whose electric properties lie between those of InSb and AlSb.

With the antimonides, a certain technological superiority of the bodies of the type $A_{III}$ $B_{V}$ over bodies of the type $A_{II}$ $B_{VI}$ is in evidence. While the solidification or phase diagrams for the $A_{II}B_{VI}$ compounds are unknown because of the greatly varying $B_{VI}$ contents due to evaporation, these diagrams can be determined for the antimonides without gaps.

Various methods are available for the production of the compounds $A_{III}B_{V}$. For instance, the compounds may be melted together (applicable with AlSb, GaSb, InSb), or the compounds may be obtained, for instance, by reducing the oxide of the trivalent element with the aid of a stream of hydrogen loaded with the vapor of the pentavalent element (applicable with GaAs, InAs).

Since the electric properties of these substances are very greatly affected by departures from the exact stoichiometric conditions, only raw materials of highest purity are to be employed. To be considered as impurities of essential influence upon the electric conductance are the elements of the second group of the periodic system acting as defect-electron producers (acceptor impurities), and the elements of the sixth group acting as excess-electron producers (donor impurities). In this respect, the compounds $A_{III}B_{V}$ behave differently from the elements of the fourth group of the periodic system. Particularly, the oxygen content has a decisive significance.

A remarkable property of these compounds, as evidenced by the phase diagrams, lies often in the fact that in the thermodynamic sense no solubility of the components in the solid compounds is possible. This is a prerequisite for the possibility of producing the pure crystallized compounds.

For most electric applications of the semiconductors $A_{III}B_{V}$, particularly for the control effect, it is necessary that an electron-hole pair within the crystal drift as far as possible before recombining. To secure this effect, the particular semiconductor must be produced in its monocrystalline form, for instance, so that a defined temperature gradient travels through the melt with a defined velocity, or by pulling the monocrystal out of the melt. In both cases, a monocrystalline germ can be brought into contact with the molten substance.

For influencing the electric properties of the compounds $A_{III}B_{V}$, the following methods are applicable. (1) Melting in vacuum in order to vary the composition by evaporation of one of the components. (2) Casting within a protective gas (inert gas, nitrogen or hydrogen) for preventing the vaporization of one component, for instance during the crystallizing process. (3) Casting within an enclosed receptacle to prevent loss by evaporation, for instance in an evacuated and fused-off quartz tube or in an encloseable graphite crucible, all parts of the vessel being kept at a high temperature to prevent precipitation of one component onto colder vessel parts.

Graphite, in many cases, is well suitable as a crucible material for melting the compounds $A_{III}B_{V}$, especially the antimonides. This is important because graphite can be produced with any desired spectral purity.

Split molds of graphite are especially suited for the casting of semiconductive crystals of the compounds $A_{III}B_V$ that are to be given a profiled cross section adapted to a particular application. This is significant since the semiconductor crystals $A_{III}B_V$ are brittle bodies difficult to fabricate by subsequent machining.

For reasons of exterior shape, the cast crystals (for rectifiers and control purposes, see Fig. 1 for example) must often be machined by grinding, this being a cause of disturbance in the crystalline structure. In such cases, the undisturbed crystal structure can be reestablished, and also the physical properties of the surface be modified, by an electrolytic, preferably anodic, surface treatment.

The compounds $A_{III}B_V$, particularly the antimonides, are very well suited for vaporization methods and hence for the production of thin semi-conductive layers, although the crystalline structure of such layers is apt to be considerably disturbed.

Generally, the crystalline structure of the $A_{III}B_V$ compounds is such that the four closest neighbors of any atom under consideration are located on the corners of a tetrahedron so that the eight electrons available for the valence bond (three electrons supplied by the element $A_{III}$ and five electrons supplied by the element $B_V$) are distributed in pairs over the four homopolar links between each center atom and its four next neighbors on the corners of the tetrahedron so that all bonds are saturated. This explains the definitely semiconductive character of these particular compounds.

If compounds are used in which the four next neighbors of any atom lie on the corners of a regular tetrahedron in whose center the first atom is located, then the semiconductive character is further augmented due to the equality of the valence forces.

It has been mentioned that, for the purposes of the invention, the antimonides of Al, Ga, In are particularly favorable. Among these, aluminum antimonide (AlSb) deserves special mention for the following reasons.

The raw materials of this compound are available in large quantities and at low cost. Besides, the AlSb compound is very closely related to germanium as regards physical properties so that this compound permits obtaining to a large extent the same effects as obtainable with the comparatively very expensive germanium.

Besides the antimonides, also the arsenides of Al, Ga and In (AlAs, GaAs, InAs) are of considerable significance. The raw materials for these compounds are likewise available in sufficient quantities and at low cost. The high vapor pressure of arsenic which, generally, would be disadvantageous in the production of the compounds, is strongly reduced during the formation of the compounds, provided a too large amount of excess arsenic is avoided, a condition that can readily be satisfied. Consequently, the arsenides may also be produced in a simple manner.

It has been explained that the new semiconductors may be produced in the form of a crystal within or from a melt. It is known that semiconductor crystals which have successive zones of different electrical properties are of particular significance for various practical applications. For instance, a semiconductor crystal which in one zone is an excess-electron (n-type) conductor and in the adjacent zone a defect-electron conductor (hole conductor, p-type), is, in general, especially well suitable as a rectifier. Furthermore, a semiconductor crystal having, for instance, an excess-electron conductance or n-type zone followed by a defect-electron conductance or p-type zone and again followed by an n-type zone, is applicable as a controllable resistor. In this respect reference may be made to those devices that have become known as "transistors." As is also known, the number of successive zones of different electric properties may be increased. As regards the arrangement of the electrodes on such crystals, the same methods and designs may be employed to such crystals as are described in the available literature for transistors and similar semiconductor devices. The known p-n-junctions may also be obtained with the aid of successive zones of different electric properties.

The principle of producing special results by providing a series of electrically different zones is also applicable to semiconductor devices according to the invention, as will be explained presently.

Figure 2:
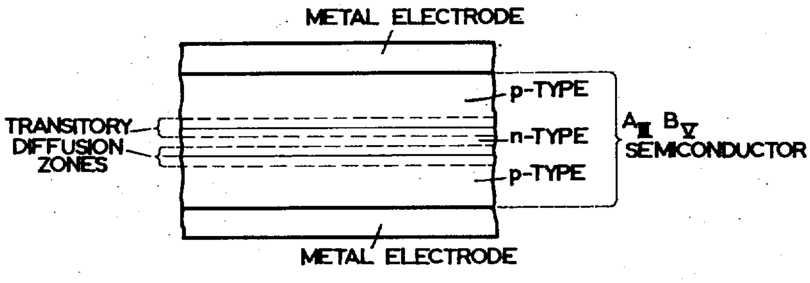
Figure 3:
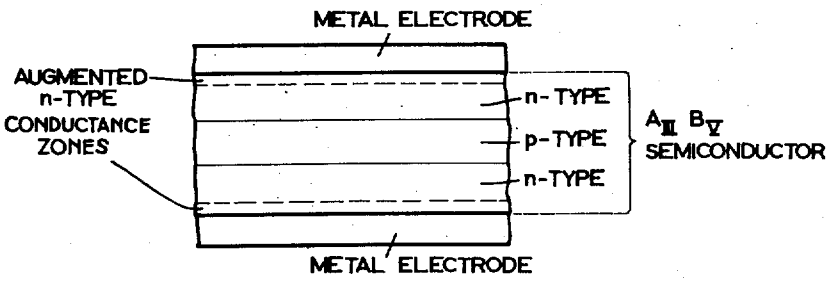

To produce a plural-zone crystal device according to the invention, the crystal may be produced in a melt as described in the foregoing, except that the composition of the melt is changed during the growth of the crystal so that the crystal develops zones of different electric properties such as those indicated in Figs. 2 and 3.

Various ways are available for thus changing the composition of the melt. An especially simple method is the following. The composition of the melt is varied by the introduction of additional substances while the crystal is growing. For producing a zone with a pronounced excess-electron conductance, a substutional donor substance pertaining to the sixth group of the periodic system is preferably added, particularly tellurium or selenium. It suffices to introduce the additional substance in a very small quantity which, in comparison with the total quantity of the melt, may be looked upon as being not more than a "trace." For properly dosing these small amounts it is preferable to first prepare a prealloy. This will be understood from the following example. If, for instance, a semiconductor crystal is to be formed from a main substance of aluminum and antimony as described in the foregoing, then the prealloy is produced by adding the desired additional substance, for instance, tellurium or selenium, first to a measured amount of aluminum (or antimony, or aluminum antimonide). This addition is given a very small quantity compared with the amount of substance to which it is added.

The resulting alloy of the main substance (aluminum or antimony or aluminum antimonide) with the additional substance (selenium or tellurium) is then introduced, in a corresponding quantity, into the melt from which the crystal is to be produced. In the example here considered, the alloy is added to the molten and compounded aluminum and antimony. The additional substance then has the suitable dilution and represents merely a trace in comparison with the total quantity of the melt.

For producing in the growing crystal a zone of a pronounced defect-electron conductance, a substance of the second group of the periodic system is added to the melt. Magnesium, zinc or cadmium are particularly suitable for this purpose. Such acceptor or hole-producing additions are also to be introduced in a very small quantity i. e. as a trace. The method of introduction may be the same as explained above with respect to excess-electron producing substances.

If several zones of different electric properties are to follow each other in the crystal, at first the one additional substance and later the other additional substance are added to the melt. This sequence can be extended as desired. That is, after adding the second substance, the first additional substance may again be introduced and thereafter again the second substance, if, for instance, four zones of alternating conductance types are to follow one another.

The aim to produce zones of different electric properties within the crystal growing in the melt may also be attained in the following manner. For producing the crystal, a melt is used which from the beginning contains certain additional substances generally, of course, in very small quantities or traces. During the growth of the crystal in this melt a vacuum is produced above the melt so that certain additional substances particularly the defect-electron producing substances (for instance, tellurium or selenium) evaporate from the melt thus varying the composition of the melt. While the crystal is growing, a zone is thus produced which differs electrically from the previously grown portion of the crystal. The method can further be carried out by removing the vacuum during the further growing period of the crystal. Later on, the vacuum may again be applied after certain quantities of the same or of a different additional substance have been introduced into the melt. This procedure may be repeated as desired.

Another method of producing in a semiconductor crystal according to the invention several electrically different zones is the following. Placed upon the surface of the crystal is a substance of such properties and of such a distribution that the substance diffuses at least partially into the heated crystal to produce therein the desired zones of different electric properties. This method can be carried out in several ways. For instance, the method may start with an n-type semiconductor crystal. Deposited upon such a crystal is an acceptor impurity, characterized by defect-electron conductance (p-conductance). This substitutional impurity may consist of an element of the second group of the periodic system (such as cadmium, zinc, magnesium). The deposition may be effected by precipitating the acceptor impurity from its gas phase onto the crystal especially at the surface portions adjacent to the zone to be modified. The crystal is heated previous to the application of the p-conductive substance, or also during the application or after the application. As a result, the p-conductive substance diffuses into the heated crystal and produces therein the desired p-type zone.

It is also possible to start with a defect-electron conductive (p-conductive) crystal and to locally apply thereto a substitutional donor impurity, i. e. a substance tending to produce excess-electron conductance (n-conductance). For instance, an element of the sixth group of the periodic system (such as tellurim or selenium) may thus be applied. The rest of the procedure is as described previously. That is, the crystal is heated either previous, during or after the application of the n-conductive substance so that this substance diffuses into the heated crystal to produce therein one or more n-type conductance zones.

The semiconductor crystal to be subjected to the above described zone-producing methods may consist, for instance, of aluminum antimonide with suitable additional substances. If the semiconductor is intended to be n-conductive, then the elements of the sixth group of the periodic system, for instance selenium or tellurium, are suitable additions. If, however, the semiconductor crystal is to be p-conductive, then one or more elements of the second group of the periodic system (such as cadmium, zinc, magnesium) are added to the aluminum antimonide material.

The process according to the invention may also be carried out by composing the semiconductor body, so to say, of prefabricated zones. For instance, an n-type crystal, for instance, of aluminum antimonide (AlSb) with corresponding additions, is joined together in face-to-face contact with a p-conductive crystal, for instance, also of aluminum antimonide (AlSb) having other additions. Heat is then applied to the two crystals so that a mutual diffusion occurs at the contact faces thus producing a p-n junction within the composite body. The same application of heat in conjunction with mechanical pressure may also serve to produce a solid mechanical junction between the two crystals thus resulting in an integral crystalline body having two outer zones joined by a transitory intermediate zone. Previous to processing the component crystals in this manner, both are well adapted to each other by grinding at the faces to be joined. This permits obtaining a safe coherence of the two component bodies in accordance with the type of joint known in the technology of optical devices for firmly joining two glass bodies of a composite lens system. The process described in this paragraph, of course, may also be applied to more than two crystals or crystal pieces so that a total body is obtained with three or more zones alternately different as regards types of conductance or other electric properties.

Figure 12:
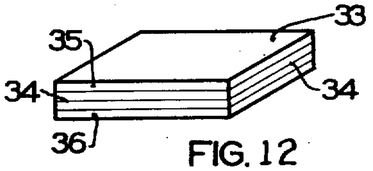
Fig. 12 illustrates schematically a semiconductor crystal with a p-n junction, comprising a zone of augmented p-type conductance and a zone of augmented n-type conductance.
Figure 11:
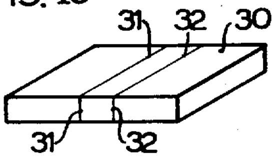
Fig. 11 shows a semiconductor crystal with two p-n junctions.

The method may also be carried out by joining two crystals of the same type of conductance (either n-type or p-type) by an intermediate layer having or producing the opposite type of conductance (Figs. 11, 12). By applying heat to the composite structure, the intermediate layer is caused to diffuse at both sides into the respective crystals thus producing in the total body a p-n-p junction (Fig. 11) or a n-p-n junction (Fig. 12). The above described expedients for effecting the desired mechanical coherence are also applicable to the last mentioned modification. Another way of producing similar crystal devices is to break a crystal of a given type of conductance into two parts, then applying a very thin intermediate layer of the opposite conductance type onto the break surface of one or both crystal parts, particularly by precipitation from the vaporous state, and thereafter joining the two crystals at the break while applying heat and preferably also mechanical pressure. This also produces diffusion zones in the crystal so that the semiconductor shows the desired n-p-n or p-n-p junction (see also Figs. 11, 12).

The just mentioned intermediate layer, depending upon whether this layer or the diffusion zone formed thereby is to be n-conductive or p-conductive, is preferably chosen from an element of the sixth group of the periodic system (such as tellurim or selenium), or from the elements of the second group of the periodic system (for instance, cadmium, zinc, magnesium). The expedients mentioned at the end of the next to the last preceding paragraph are again applicable.

It is not necessary for many purposes to have the electrically different zones within the semiconductor crystal abruptly distinct from one another but is also possible to permit gradual transitions between the zones. The zones of different electric properties further need not always be distinct as regards their type of conductance. For certain purposes, zones of the same type of conductance may succeed each other, being then distinguished by the magnitudes of their respective conductance values. This applies particularly to the purpose of producing a barrier-free contact between a crystal and a pertaining electrode. To this end, for instance, a particular spot of an n-type semiconductor crystal is provided with a likewise n-type substance, for instance, an element of the sixth group of the periodic system (such as tellurim or selenium). Heat is applied for causing this substance to diffuse at least partially into the heated crystal. Thus a zone of increased n-conductance is produced. If, thereafter, a metallic electrode is placed upon this spot, a barrier-free contact junction is obtained between the electrode and the crystal.

A similar method is applicable for a defect-electron conductive crystal or crystal part to which, in this case, a defect-electron producing substance, for instance, an element of the second group of the periodic system (such as cadmium, zinc, magnesium) is applied. The substance diffuses into the crystal under the application of heat and produces at the particular spot a zone of increased p-conductance.

The various methods and ways described in the foregoing for producing zones of different electric properties within the semiconductive crystal may be combined with each other. That is, several of these methods may be applied to the same crystal simultaneously or in succession for either producing the desired electrically different zones or augmenting the zone differences.

Semiconductors according to the invention may be used in widely different ways such as for the various above-mentioned applications of the known semiconductors. This will be apparent from the examples described in the following with reference to Figs. 4 to 12.

Figure 4:
Figs. 4, 5 and 6 show perspective views of a resistor, a detector and a three-electrode device respectively.

The resistor according to Fig. 4 comprises a rod-shaped semiconductor body 1 composed as described above, and two electrodes 2 and 3 placed flat upon the longitudinal ends of this body. The connection wires 4 and 5 are fixed to the electrodes 2 and 3. The device shown in Fig. 1 illustrates that the new semiconductor in the simplest case may be used as an electric resistor. Such a resistor has the advantage over usual wire resistors that it occupies less space and in certain cases is less expensive.

Figure 5:
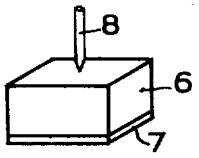

The detector according to Fig. 5 consists of a semiconductor crystal 6 joined with a flat electrode 7, and a point electrode 8. The electric contact surface of the latter, consequently, is small compared with that of the flat electrode 7. The electrodes 7 and 8 are to be connected to an external circuit. The device may serve as a detector or as a rectifier. The semiconductor crystal 6 is composed or made in the manner stated above.

Figure 6:
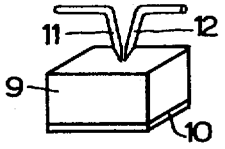

The three-electrode device of Fig. 6, having a semiconductor crystal according to the invention, is designed as a transistor and may be used in the same manner as the known devices of this type. The device comprises the semiconductor crystal 9, a flat electrode 10, and two pointed electrode wires or cats whiskers 11 and 12 placed in close proximity to each other. The crystal 9 consists of one of the $A_{III}B_V$ semiconductors described above, such as AlSb.

Figure 7:
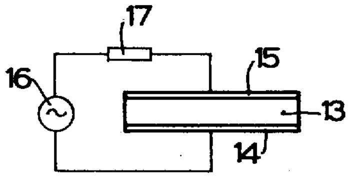
Fig. 7 shows a barrier-layer (dry-type) rectifier and Fig. 8 a three-electrode device with respective examples of applicable electric circuits.

Fig. 7 illustrates a rectifier with one of the applicable electric circuits. The rectifier itself comprises the semiconductor crystal 13 and two flat electrodes 14 and 15. Through the two electrodes 14 and 15 the semiconductor crystal is connected in the circuit of an alternating-current source 16 which comprises a load 17 to be supplied with rectified current. The rectifier may include a barrier layer between one of the two electrodes and the semiconductor body, as is the case in the known selenium rectifiers; or the two electrodes 14, 15 may contact the semiconductor body 13 without any barrier layer if the semiconductor body is given a p-n junction as explained above and as also described below with reference to Fig. 9.

Figure 8:
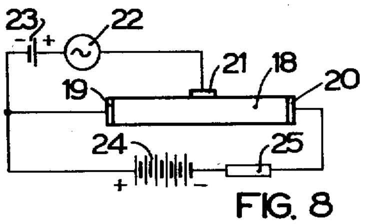

The device shown in Fig. 8 has an $A_{III}B_V$ semiconductor crystal 18 joined with three electrodes 19, 20, and 21. In the illustrated circuit the electrode 21 serves as a control electrode and is connected to one pole of an alternating-current source 22. For producing the necessary bias voltage, the other pole of source 22 is connected through a direct-current source 23 to the electrode 19 and also through a second direct-current source 24 and an external resistor 25 to the electrode 20. The circuit therefore has two branches, one comprising the elements 19, 23, 22, 21 and the other elements 19, 24, 25 and 20. Voltage variations of the alternating-current source 22 are reproduced on an amplified scale in the external circuit branch of the external resistor 25.

Figure 9:
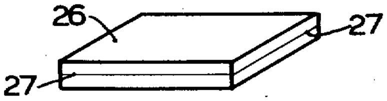
Fig. 9 shows schematically a semiconductor crystal with a p-n junction, and Fig. 10 a different semiconductor crystal likewise with a p-n junction.

Fig. 9 shows a flat semiconductor crystal consisting of one of the above-named semiconductors which has a p-n junction schematically indicated by the plane 27. Thus the semiconductor body 26 has on one side of the plane 27 an essentially n-type conductance, and on the other side of the plane an essentially p-type conductance. The transition from p-type conductance to n-type conductance takes place in a small zone of which the plane 27 is the center plane. The electrode for the semiconductor crystal of Fig. 9 may be arranged as exemplified by Fig. 7 so that the semiconductor crystal 26 of Fig. 9 takes the place of body 13 in the device of Fig. 7 to produce the rectifier effect.

Figure 10:
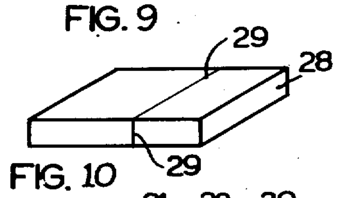

The flat semiconductor crystal 28 shown in Fig. 10 has a p-n junction perpendicular to that of Fig. 9. This is indicated in Fig. 10 by the plane 29 which again is intended to represent the center plane of a zone in which the transition from p-type conductance to n-type conductance takes place. Since this zone is relatively narrow, the semiconductor crystal 28 may be looked upon as consisting essentially of two zones on the two sides respectively of the plane 29, one of these zones having p-type conductance and the other n-type conductance. The semiconductor crystal of Fig. 10, for instance, may be used in the place of the semiconductor crystal 18 of Fig. 8 in such a manner that the control electrode 21 is applied to the n-type zone of the crystal 28.

As explained with reference to Figs. 2 and 3, the semiconductor crystals according to the invention may contain several p-n or n-p junctions so that, if for instance two such transitions are considered together, a p-n-p junction or an n-p-n junction will result. Another embodiment of such a crystal is illustrated in Fig. 11 at 30. The planes 31 and 32 denote an n-p junction and a p-n junction respectively. The semiconductor crystal thus comprises five zones, namely, beginning from the left side of the fiugre, a zone of p-type conductance followed by the p-n junction zone indicated by its center plane 31, a zone of n-type conductance between the two planes 31 and 32, the n-p junction zone indicated by its center plane 32, and finally a zone of p-type conductance. It will be recognized that this sequence is the same as that apparent from Fig. 2. Similarly, the crystal 30 may be given an n-p-n junction in analogy to Fig. 3, so that the crystal has two outer n-type zones and a p-type middle zone joined with the outer zones by respective p-n junction zones.

The crystal according to Fig. 11 may be used for the device of Fig. 5, for instance, so that it replaces the crystal 18. The control electrode 21 is then placed upon the zone of n-type conductance between the two planes 31 and 32.

The flat semiconductor crystal 33 illustrated in Fig. 12 has a p-n junction indicated by its center plane 34 and has also a zone of increased conductance on either or both sides of this plane. In Fig. 12 it is assumed that two such zones 35 and 36 of increased conductance are formed on both sides of plane 34. The crystal according to Fig. 12 consisting of one of the $A_{III}B_V$ materials described above, may be used, for instance, so that it replaces the crystal 13 in the rectifier shown in Fig. 7. Then the electrodes 14 and 15 are applied to the top and bottom surfaces to form a rectifier.

The p-n junctions, n-p junctions, and the zones of increased conductance referred to in connection with Figs. 9 to 12 are produced by the methods described previously.

I claim:

1. A semiconductor device comprising a crystalline body and circuit means electrically connected therewith, said body being formed of a compound of an element selected from the group consisting of boron, aluminum, gallium and indium with an element selected from the group consisting of nitrogen, phosphorus, arsenic and antimony.

2. A semiconductor device comprising a crystalline body and electric circuit means connected therewith, said body consisting substantially of a monocrystal semiconductor formed of a compound of an element selected from the group consisting of boron, aluminum, gallium and indium with an element selected from the group consisting of nitrogen, phosphorus, arsenic and antimony.

3. An electric semiconductor device comprising a crystalline semiconductor body and electric connecting means in contact with said body, said body consisting essentially of a compound of an element selected from the group consisting of boron, aluminum, gallium and indium with an element selected from the group consisting of nitrogen, phosphorus, arsenic and antimony.

4. In a semiconductor device according to claim 1 said body consisting of an antimonide.

5. In a semiconductor device according to claim 1 said body consisting of aluminum antimonide.

6. In a semiconductor device according to claim 1 said body consisting of a compound of gallium with an element selected from the group consisting of antimony and arsenic.

7. In a semiconductor device according to claim 1 said body consisting of an arsenide.

8. In a semiconductor device according to claim 1 said body consisting of a compound of indium with an element selected from the group consisting of antimony and arsenic.

9. In a semiconductor device according to claim 1 said compound consisting of a phosphide.

10. In a semiconductor device according to claim 2 said compound consisting of a nitride.

11. A semiconductor device comprising a crystalline body and electric connecting means in contact with said body, said body being formed of a compound of an element selected from the group consisting of boron, aluminum, gallium and indium with an element selected from the group consisting of nitrogen, phosphorus, arsenic and antimony, and said body having a plurality of zones of different electric conductance.

12. In a device according to claim 11, said different zones consisting of the same compound of said two elements, one of said zones containing in said compound a trace of acceptor impurity and having p-conductance, and another one of said zones containing in said compound a trace of donor impurity and having n-conductance.

13. In a semiconductor device according to claim 1 said compound body containing lattice-defect impurity atoms selected from the second and sixth group of the periodic system.

14. In a semiconductor device according to claim 1 said compound body containing a trace of donor substance selected from the group consisting of selenium and tellurium and having n-type conductance due to said substance.

15. A semiconductor device according to claim 1 said compound body containing a trace of acceptor substance selected from the group consisting of magnesium, zinc and cadmium, and having p-type conductance due to said substance.

References Cited in the file of this patent

UNITED STATES PATENTS

| | | |
|---|---|---|
| 698,769 | Walker | Apr. 29, 1902 |
| 2,391,706 | Jackson et al. | Dec. 25, 1945 |
| 2,524,035 | Bardeen et al. | Oct. 3, 1950 |
| 2,556,711 | Teal | June 12, 1951 |
| 2,569,347 | Shockley | Sept. 25, 1951 |
| 2,602,211 | Scaff et al. | July 8, 1952 |

FOREIGN PATENTS

| | | |
|---|---|---|
| 435,754 | Great Britain | Sept. 23, 1935 |

OTHER REFERENCES

Wright: Journal Soc. Chem. Industry, vol. XI, pp. 492–494, June 1892.

J. Amer. Chem. Soc., vol. 66, pp. 1666–1672 (1944).

Nature, vol. 165, pp. 722–723 (1950).

Z. Anorg. Allgen., Chem., vol. 239, pp. 282–287 (1938).

Gazz. Chim. ital., vol. 71, pp. 58–62 (1941); vol. 77, pp. 24–45 (1947).